(12) United States Patent
Sundblad et al.

(10) Patent No.: US 9,602,123 B2
(45) Date of Patent: Mar. 21, 2017

(54) COGNITIVE SIGNAL CONVERTER

(71) Applicants: Anacatum Design AB, Linköping (SE); Fingerprint Cards AB, Göteborg (SE)

(72) Inventors: Rolf Sundblad, Ljungsbro (SE); Staffan Holmbring, Linköping (SE); Robert Hägglund, Linköping (SE); Emil Hjalmarsson, Linköping (SE)

(73) Assignees: ANATACUM DESIGN AB, Linköping (SE); FINGERPRINT CARDS AB, Göteborg (SE)

( * ) Notice: Subject to any disclaimer, the term of this patent is extended or adjusted under 35 U.S.C. 154(b) by 0 days.

(21) Appl. No.: 15/107,568

(22) PCT Filed: Dec. 3, 2014

(86) PCT No.: PCT/SE2014/051445
§ 371 (c)(1),
(2) Date: Jun. 23, 2016

(87) PCT Pub. No.: WO2015/108463
PCT Pub. Date: Jul. 23, 2015

(65) Prior Publication Data
US 2016/0322984 A1    Nov. 3, 2016

(30) Foreign Application Priority Data

Jan. 15, 2014    (SE) ...................................... 1450033

(51) Int. Cl.
*H03M 1/00*    (2006.01)
*H03M 1/12*    (2006.01)
(Continued)

(52) U.S. Cl.
CPC ....... *H03M 1/1245* (2013.01); *H03M 1/1009* (2013.01); *H03M 1/1265* (2013.01);
(Continued)

(58) Field of Classification Search
CPC .... H03M 1/1245; H03M 1/38; H03M 1/1009; H03M 1/46; H03M 1/12; H03M 3/458; H03M 1/208
(Continued)

(56) References Cited

U.S. PATENT DOCUMENTS 4,792,787 A    12/1988    Speiser et al.
5,717,832 A    2/1998    Steimle et al.
(Continued)

FOREIGN PATENT DOCUMENTS

EP    0446968 A2    9/1991
EP    0467577 A2    1/1992
(Continued)

OTHER PUBLICATIONS

Chen, F. et al., "Design and Analysis of a Hardware-Efficient Compressed Sensing Architecture for Data Compression in Wireless Sensors" IEEE Journal of Solid-State Circuits, vol. 47, No. 3, Mar. 2012, pp. 744-756.
(Continued)

*Primary Examiner* — Jean B Jeanglaude
(74) *Attorney, Agent, or Firm* — Remarck Law Group PLC

(57) ABSTRACT

A cognitive signal converter adapted to produce a digital output signal based on an analog input signal comprises an analog-to-digital converter (ADC) and a cognitive network. The ADC is adapted to produce a digital converted signal based on the analog input signal, a sample clock signal and a process clock signal by sampling the analog input signal in accordance with the sample clock signal and quantizing each analog input signal sample based on the process clock signal. The cognitive network is adapted to receive the digital converted signal of the ADC, control at least one of the sample clock signal and the process clock signal based
(Continued)

on the received digital converted signal and one or more characteristics of the analog signal source, and produce the digital output signal based on the received digital converted signal. Corresponding integrated circuit, electronic device and method are also disclosed.

17 Claims, 4 Drawing Sheets

(51) Int. Cl.
*H03M 1/10* (2006.01)
*H03M 1/38* (2006.01)
*H03M 1/46* (2006.01)
*H03M 1/06* (2006.01)

(52) U.S. Cl.
CPC ............... *H03M 1/38* (2013.01); *H03M 1/46* (2013.01); *H03M 1/0624* (2013.01)

(58) Field of Classification Search
USPC .................................................. 341/155, 122
See application file for complete search history.

(56) References Cited

U.S. PATENT DOCUMENTS

| 2006/0176201 | A1  | 8/2006  | Kimura et al. |
| 2010/0165145 | A1* | 7/2010  | Kuroki ................. H04N 3/1593 348/231.2 |
| 2011/0115940 | A1* | 5/2011  | Ojima ................. H04N 5/23212 348/222.1 |
| 2011/0148682 | A1  | 6/2011  | Rigby et al. |
| 2011/0261225 | A1* | 10/2011 | Niinami .................. G06T 7/204 348/223.1 |
| 2011/0273584 | A1* | 11/2011 | Ogawa .................. H04N 9/735 348/223.1 |
| 2011/0304489 | A1  | 12/2011 | Christer et al. |
| 2013/0009796 | A1  | 1/2013  | Sakiyama et al. |

FOREIGN PATENT DOCUMENTS

| EP | 0624289 B1    | 9/1997  |
| GB | 2265775 A     | 10/1993 |
| WO | 9960705 A1    | 11/1999 |
| WO | 2007093478 A1 | 8/2007  |
| WO | 2010042051 A1 | 4/2010  |
| WO | 2012123578 A1 | 9/2012  |

OTHER PUBLICATIONS

Chen, Q. et al., "Universal Classifier Synchronizer Demodulator" IEEE, 2008, pp. 366-371.

Groza, V. et al., "Differential Predictive Floating-Point Analog-to-Digital Converter" Measurement, vol. 35, No. 2, Mar. 2004, pp. 139-151.

International Search Report and Written Opinion dated Apr. 27, 2015 for International Application No. PCT/SE2014/051445, 12 pages.

International Preliminary Report on Patentability for International Application No. PCT/SE2014/051445 mailed Dec. 9, 2015 (7 pages).

\* cited by examiner

COGNITIVE SIGNAL CONVERTER

CROSS-REFERENCE TO RELATED APPLICATIONS

This application is a 371 U.S. National Stage of International Application No. PCT/SE2014/051445, filed Dec. 3, 2014, which claims priority to SE Application No. 1450033-4, filed on Jan. 15, 2014. The disclosure of each of the above applications is incorporated herein by reference in their entirety.

TECHNICAL FIELD

The present invention relates generally to the field of analog-to-digital converters (e.g. analog-to-information converters). More particularly, it relates to control and optimization of the operation of such converters.

BACKGROUND

Electronic equipment is commonly implemented using digital technology instead of analog technology, while signals to be processed by the electronic equipment are often initially analog (e.g. radio signals, sensor output signals, image captures, etc.). Typically, the more advanced the digital technology gets the more demanding the task of converting an analog signal to a digital signal suitable for the digital technology implementation becomes.

Conceptually, an analog-to-digital converter (also denoted ADC or A/D converter) is very well know in the art as well as its basic functionality (sample-and-hold, quantization) and will not be elaborated on further herein.

It is often beneficial, or even necessary, that the analog-to-digital conversion fulfills certain requirements. Such requirements may, for example, comprise accuracy requirements (in terms of sampling speed and/or quantization precision for each sample) and/or energy consumption requirements. The quantization precision may, for example, comprise a quantization range and/or a maximum deviation from the analog signal sample value. It may often be cumbersome to fulfill all requirements of the analog-to-digital conversion, in particular if the implementation of the analog-to-digital conversion should be reasonably cheep and/or with a small circuit footprint. Typically, if an ADC is designed to fulfill requirements of a particular application it may be unsuitable for use in another application.

Therefore, there is a need for arrangements that enable adaptation of the operation of an ADC to a particular application.

US 2011/0148682 A1 discloses a predictive analog-to-digital converter system that includes a sampling section producing a sampled analog input signal with a summer section combining the sampled analog input signal and an analog prediction signal to produce an analog prediction error signal. An error analog-to-digital convertor digitizes the analog prediction error signal. A second summer is coupled to the digital error signal output (from the error analog-to-digital convertor) and a digital prediction signal, and generates a digital output signal. A feedback section is coupled to the digital output signal and providing the digital prediction signal and the analog prediction signal.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof.

It is an object of some embodiments to enable adaptation of the operation of an ADC to a particular application.

According to a first aspect, this is achieved by a cognitive signal converter connectable to an analog signal source via an analog signal input port and adapted to produce a digital output signal based on an analog input signal received via the analog signal input port. The cognitive signal converter comprises an analog-to-digital converter and a cognitive network.

The analog-to-digital converter is adapted to produce a digital converted signal based on the analog input signal, a sample clock signal and a process clock signal by sampling the analog input signal in accordance with the sample clock signal and quantizing each analog input signal sample, wherein the quantizing process is operated by the process clock signal.

The process clock signal is used to control an operational speed of the analog-to-digital converter when quantizing each analog input signal sample.

That the quantizing process is operated by the process clock signal should be interpreted as an analog-to-digital converter performing an operation during each period of the process clock signal. Thus, the process clock signal acts a process clock for the analog-to-digital converter.

The cognitive network is adapted to receive the digital converted signal of the analog-to-digital converter, control at least one of the sample clock signal and the process clock signal based on the received digital converted signal and one or more characteristics of the analog signal source, and produce the digital output signal based on the received digital converted signal.

The analog input signal may, for example, comprise any of a streaming data signal, a radio signal, a sensor output signal, an electrocardiography signal, a video signal, a 3D-video signal, a photography data signal, a fingerprint reader signal, etc.

The cognitive network may be a control arrangement. Additionally or alternatively, the cognitive network may also be a classification arrangement and/or prediction arrangement.

A typical cognitive network may be a functional unit (implemented in hardware or software or a combination thereof) adapted to perform prediction of a future signal part based on a current signal part and/or a previous signal part.

In some embodiments, the functional unit may be adapted to predict a next sample of the signal.

In some embodiments, the functional unit may be adapted to determine which of a number of signal types the signal belongs to and thereby predict the future part of the signal.

A typical cognitive network may, additionally, be a functional unit (implemented in hardware or software or a combination thereof) adapted to dynamically develop its prediction algorithms.

For example, the cognitive network may be adapted to match a plurality of signals to each other and distinguish one or more signal characteristics that are common to two or more of the signals. Such signal characteristics may then be used in a prediction algorithm to determine whether or not a new signal is of a same type as one or more of the plurality of signals.

Thus, the cognitive network may be a (possibly self-learning) predicting arrangement according to some embodiments.

An example of a cognitive network is disclosed in "Universal Classifier Synchronizer Demodulator", Qinqin Chen, Ying Wang, Charles W. Bostian, published in Performance, Computing and Communications Conference, 2008, IPCCC 2008, IEEE International.

For example, the cognitive network may be an artificial neural network (see e.g. U.S. Pat. No. 5,717,832). In some embodiments, the cognitive network may be a streaming recognition and prediction arrangement.

The analog-to-digital converter may be any suitable known or future type of analog-to-digital converter. For example, the analog-to-digital converter may comprise one or more successive approximation register analog-to-digital converters (SAR ADC, see e.g. WO 2012/123578 A1 and EP 0624289 B1). For high sampling frequencies it may be necessary or at least beneficial to use the analog-to-digital converter structures comprising several constituent analog-to-digital converters to be able to accommodate the high sampling frequency. Such structures alleviate the processing speed requirements on each constituent analog-to-digital converter. Examples of such analog-to-digital converter structures are pipe-lined analog-to-digital converters and time-interleaved analog-to-digital converters (e.g. parallel successive analog-to-digital converters). US 2011/0304489 A1, WO 2007/093478 A1, EP 0624289 B1 and WO 2010/042051 A1 describe various example time-interleaved analog-to-digital converter structures.

In some embodiments, the cognitive network may be further adapted to predict at least part of a next sample of the digital converted signal based on the received digital converted signal and one or more characteristics of the analog signal source, and control at least one of the sample clock signal and the process clock signal based on the at least partially predicted next sample.

According to some embodiments, the analog-to-digital converter may be further adapted to produce the digital converted signal based on the at least partially predicted next sample. For example, the at least partially predicted next sample may be fed back to the analog-to-digital converter. The analog-to-digital converter may use the at least partially predicted next sample as an initial value for production of the next sample of the digital converted signal.

This may have the advantage that the most significant bits of the next sample does not need to be determined by the analog-to-digital converter, but may be extracted from the at least partially predicted next sample. As a consequence, the analog-to-digital converter may use the resources normally used for determining the most significant bits for other purposes (higher precision in the quantization, faster sampling rate and/or energy saving).

Alternatively or additionally, the at least partially predicted next sample value may be used as a reference value for the analog-to-digital converter. This may have the advantage that a smaller ADC range may be used, which in turn may lead to higher precision and/or lower energy consumption.

In some embodiments, the analog-to-digital converter may be adapted to produce the digital converted signal by comparing a next sample of the analog input signal with the at least partially predicted next sample.

The cognitive network may, for example, be adapted to control the sample clock and/or the process clock in relation to a difference between the received digital converted signal and the at least partially predicted next sample. If the absolute value of the difference is small (e.g. smaller than a first threshold value), the sample clock period may be increased according to some embodiments (since it may be assumed that the analog input signal is not changing rapidly). If the absolute value of the difference is large (e.g. larger than a second threshold value, which may or may not be the same as the first threshold value), the sample clock period may be decreased according to some embodiments (since it may be assumed that the analog input signal is changing rapidly). This has the advantage that the analog-to-digital converter, when the sampling clock period is increased, may use the resources normally used for accommodating a high sampling rate for other purposes (higher precision in the quantization and/or energy saving (e.g. by lowering the process clock rate)).

The cognitive network may be further adapted to control a conversion range of the analog-to-digital converter based on the at least partially predicted next sample in some embodiments.

The digital output signal may, according to some embodiments, be equal to one of the received digital converted signal, an adjusted version of the received digital converted signal, and a classification of the analog input signal based on the received digital converted signal.

When the digital output signal is a classification of the analog input signal, and also in other appropriate situations, the cognitive signal converter may be considered as an analog-to-information converter. An analog-to-information converter typically has the advantage of being able to present the information of the analog signal in a highly compressed way (see e.g. Chen, Chandrakasan, Stojanovic, "Design and Analysis of a Hardware-Efficient Compressed Sensing Architecture for Data Compression in Wireless Sensors", IEEE Journal of Solid-State Circuits, vol. 47, No. 3, March 2012, pp. 744-756).

In some embodiments, the cognitive signal converter may further comprise an image processing framer adapted to subject the digital converted signal of the analog-to-digital converter to a framing operation. In such embodiments, the cognitive network is adapted to receive the framed digital converted signal as the digital converted signal of the analog-to-digital converter. These embodiments are particularly suitable when the analog input signal is an image signal, such as a video signal. The cognitive network may, for example, be further adapted to detect a background item of the framed digital converted signal and a moving item of the framed digital converted signal and to control the framing operation of the image processing framer based on the detection.

In yet some embodiments, the analog-to-digital converter may be a first analog-to-digital converter and the cognitive network may be a first cognitive network. Then, the cognitive signal converter may further comprise a second analog-to-digital converter and a second cognitive network, wherein the first cognitive network is adapted to control the second cognitive network. Such embodiments may be particularly suitable for processing of a 3-dimensional image signal. For example, the first analog-to-digital converter may operate on a first analog input signal from a first recording device (e.g. a camera) and the second analog-to-digital converter may operate on a second analog input signal from a second recording device recorded simultaneously with the first analog input signal, wherein the location of second recording device is offset with regard to the location of the first recording device such that they together provide a 3-dimensional image signal.

The one or more characteristics of the analog signal source may be supplemented by one or more characteristics of the analog-to-digital converter according to some embodiments.

A second aspect is an integrated circuit comprising the cognitive signal converter of the first aspect, and a third aspect is an electronic device comprising the cognitive signal converter of the first aspect or the integrated circuit of the second aspect.

According to a fourth aspect, a method is provided of operating an analog-to-digital converter. The method comprises receiving an analog input signal via an analog signal input port of a cognitive signal converter comprising the analog-to-digital converter and producing a sample of a digital converted signal based on the analog input signal, a sample clock signal and a process clock signal by sampling the analog input signal in accordance with the sample clock signal and quantizing the analog input signal sample, wherein the quantizing process is operated by the process clock signal.

The method also comprises controlling at least one of the sample clock signal and the process clock signal based on the digital converted signal and one or more characteristics of the analog signal source and producing a digital output signal based on the digital converted signal.

In some embodiments, the fourth aspect may additionally have features identical with or corresponding to any of the various features as explained above for the first aspect.

An advantage of some embodiments is that the analog-to-digital conversion may be very flexibly controlled to provide for varying requirements and/or characteristics of the analog signal source. Thereby, the figure of merit, the power consumption, and/or other performance metrics of the cognitive converter may be improved compared to other converters.

Another advantage of some embodiments is that the information conveyed by the analog signal may be presented in a compressed way and hence may be transferred in an energy efficient way.

BRIEF DESCRIPTION OF THE DRAWINGS

Further objects, features and advantages will appear from the following detailed description of embodiments, with reference being made to the accompanying drawings, in which.

DETAILED DESCRIPTION

Figure 1:
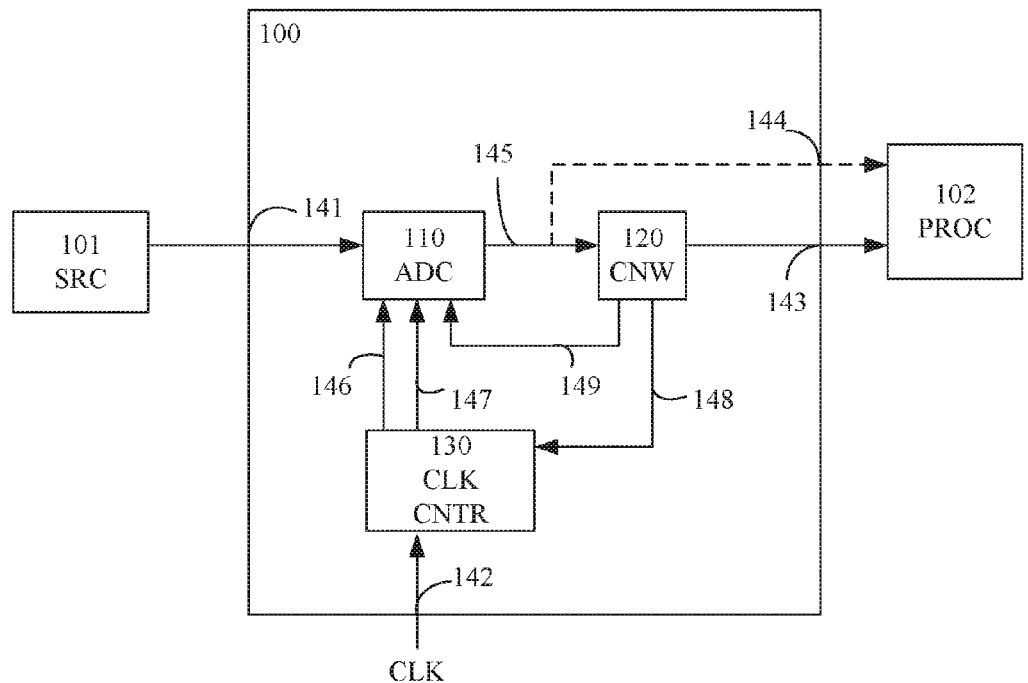
FIG. 1 is a block diagram illustrating an example arrangement comprising a cognitive signal converter according to some embodiments.

In the following, embodiments will be described where an analog input signal is input to an analog-to-digital converter and where the output of the analog-to-digital converter is used by a cognitive network to produce a digital output signal and to control the analog-to-digital converter.

The cognitive network is typically aware of (or is able to learn) one or more characteristics of the analog signal source. For example, the one or more characteristics may be achieved by training (self-learning) of the cognitive network and/or based on prior knowledge regarding the analog input signal made available to the cognitive network (e.g. by manual input, by automatic input from the analog signal source, by programming, by setting of parameters or algorithms, etc.).

The cognitive network may also be adapted to use the output of the analog-to-digital converter to predict (at least partially) one or more future samples of the output of the analog-to-digital converter. The prediction may be according to any suitable known or future method. When a predicted sample is referred to herein, that notation is meant to also include a partially predicted sample (e.g. a prediction of a subset of the bits the sample is composed of, such as, for example, a number of most significant bits or a number of least significant bits).

The cognitive network may use the output of the analog-to-digital converter (and possibly the predicted samples) to control a sample clock and/or a process clock, both used to operate the analog-to-digital converter. The sample clock is used to control the sampling of the analog input signal and the process clock is used to control the operational speed of the analog-to-digital converter when digitizing (i.e. quantizing) an analog sample to produce a sample of the output of the analog-to-digital converter.

For this purpose, a clock controller may be provided internal or external to the cognitive network. The clock controller may have a system clock signal as an input and may provide the sample clock and/or the process clock as outputs (e.g. by dividing, shifting, slicing, duplicating, etc. the system clock signal in any suitable known or future manner). The clock controller is controlled by the cognitive network based on the output of the analog-to-digital converter and one or more characteristics of the analog signal source. In some embodiments, the predicted samples may also be used to control the clock controller, for example, based on the difference (e.g. sign and/or absolute value) between ADC output samples and predicted samples or based on a matching of ADC output samples and predicted samples to a characteristic signal curve.

For example, if it may be assumed (based on the output of the analog-to-digital converter and the predicted samples in the light of the characteristics of the analog signal source) that the analog input signal is in a period where precision in the analog-to-digital conversion is not of essence, the sample clock rate may be decreased such that excessive sampling is avoided and/or the process clock rate may be decreased such that unnecessarily accurate quantization is avoided.

If it may be assumed that the analog input signal is in a period where precision in the analog-to-digital conversion is of essence and where the analog input signal changes very slowly, the sample clock rate may be decreased while the process clock rate may be increased.

If it may be assumed that the analog input signal is in a period where precision in the analog-to-digital conversion is of essence and where the analog input signal changes rapidly, the sample clock rate and the process clock rate may be increased.

Numerous other situations where various combinations of increased, decreased or unchanged rates of the sample and/or process clocks are applicable may be envisioned. When reference is made to an increase or decrease of a clock rate, clock period, or any other parameter, it may be understood as compared to a nominal value or compared to a previous value as applicable.

The predicted samples may be further used to control the operation of the analog-to-digital converter. For example, the predicted samples may be fed back from the cognitive network to the analog-to-digital converter. The analog-to-digital converter may, for example, use the predicted samples as a starting point for its quantization process. The quantization process may then comprise comparing the analog sample with the predicted next sample. (In some of these embodiments, estimation of one or more of the most significant bits is not needed. Instead, those bits may be extracted directly from the predicted sample.) Typically, the analog-to-digital converter needs fewer processing cycles to come to a specific result compared to if there was no prediction available. This may lead to lower energy consumption (e.g. by lowering of the processing clock rate). Alternatively or additionally, one or more processing cycles may be used to achieve a higher precision in the quantization (e.g. by letting the analog-to-digital converter operate in a narrower range). Yet alternatively or additionally, one or more processing cycles may be used to accommodate an increased sampling clock rate.

Thus, in some embodiments, the cognitive network may control the analog-to-digital converter by providing a predicted sample value, an operational range, a sample clock and a process clock. In some embodiments, only a subset of these control signals may be used. For example, only the adapted sample clock and the adapted process clock may be provided to the analog-to-digital converter in some embodiments.

The cognitive network is further adapted to produce the digital output signal based on the output from the analog-to-digital converter.

In some embodiments, the digital output signal is equal to the output from the analog-to-digital converter or to an adjusted version of the output from the analog-to-digital converter. For example, if the analog input signal is a quadrature amplitude modulation (QAM) signal it is known that the signal is a sinusoidal signal where the amplitude and phase belongs to a limited set of amplitudes and phases. In such cases, the cognitive network may (based on earlier samples) adjust the output based on the possible amplitudes and phases.

In other embodiments, the digital output signal may comprise a characterization (or classification) of the output from the analog-to-digital converter. For example, if it is known that the analog input signal is always in one of four different states, the cognitive network may be adapted to detect the current state based on the output from the analog-to-digital converter and the digital output signal may simply comprise an indication of the detected state (2 bits in this example). In the example of the quadrature amplitude modulation (QAM) signal above, the cognitive network may be able to detect (based on the possible amplitudes and phases) the QAM symbol after a few number of samples. Then, a symbol representation (classification) may be output and no more samples are needed during the current symbol period.

The cognitive network may produce the digital output signal based on partial samples of the output from the analog-to-digital converter. For example, if the cognitive network is able to determine a classification based on a part of a sample (e.g. based on a number of most significant bits), the classification may be used as the digital output signal and the analog-to-digital conversion may be terminated prematurely (e.g. by adjusting the process clock so that the rest of the sample is not processed and resetting the ADC for the next sample).

In some embodiments, several analog-to-digital converters may process parallel analog input signals and input them to a single cognitive network, which produces a classification based on the combination of analog-to-digital converter outputs.

As mentioned before, the analog-to-digital converter may comprise one or more successive approximation register analog-to-digital converters (SAR ADC).

The SAR ADC may, for example, be formed by a plurality of parallel ADC:s, which may be individually controlled by the cognitive network. For example, when the sampling rate is low, the cognitive network may put a corresponding number of the parallel ADC:s in a low activity (or sleep) mode to save energy.

The SAR ADC may, for example, be a time-interleaved ADC formed by a plurality of constituent SAR ADC:s, which may be individually controlled by the cognitive network. Any interleaving errors (e.g. time offsets) may be corrected in the cognitive network.

The SAR ADC may, for example, be an ADC with redundancy formed by more ADC:s than crucially needed (e.g. to be able to perform calibration of the ADC:s during run time) controlled by the cognitive network.

FIG. 1 is a schematic block diagram illustrating an example arrangement comprising a cognitive signal converter 100 according to some embodiments. The arrangement also comprises an analog signal source (SRC) 101 providing an analog input signal 141 to an analog input port of the cognitive signal converter 100 and a processor (PROC) 102 that uses the digital output signal 143 of the cognitive signal converter 100 for some purpose (e.g. further processing and/or rendering; including signal demodulation—e.g. Orthogonal Frequency Division Multiplexing (OFDM) demodulation of a Wireless Local Area Network (WLAN) receiver, object tracking in a video sequence, Moving Picture Experts Group (MPEG) encoding, fingerprint recognition, touch recognition for optical touch screens, etc.).

The cognitive signal converter 100 comprises an analog-to-digital converter (ADC) 110, a cognitive network (CNW) 120 and a clock controller (CLK CNTR) 130. The clock controller 130 is illustrated in FIG. 1 as external to the cognitive network 120. In other embodiments, the clock controller may be comprised in the cognitive network.

As has been elaborated on above, the ADC 110 processes the analog input signal 141 based on a process clock signal 147, a sample clock signal 146 and a feedback signal 149 from the cognitive network 120 to produce a digital converted signal 145. The digital converted signal 145 may be directly output to the processor 102 according to some embodiments as illustrated by 144 in FIG. 1.

The digital converted signal 145 is also input to the cognitive network 120, which may use the digital converted signal 145 and (pre-coded and/or learnt) characteristics of the signal source 101 to predict a next sample of the digital converted signal 145. As elaborated on above, the predicted sample may be fed back to the ADC 110 (via the feedback signal 149). Furthermore, the digital converted signal 145 and the characteristics of the signal source (and possibly the predicted sample) may be used by the cognitive network 120 to control (via control signal 148) the sample clock signal 146 and/or the process clock signal 147 of the clock controller 130 in relation to the system clock (CLK) 142 input to the clock controller 130.

Figure 2:
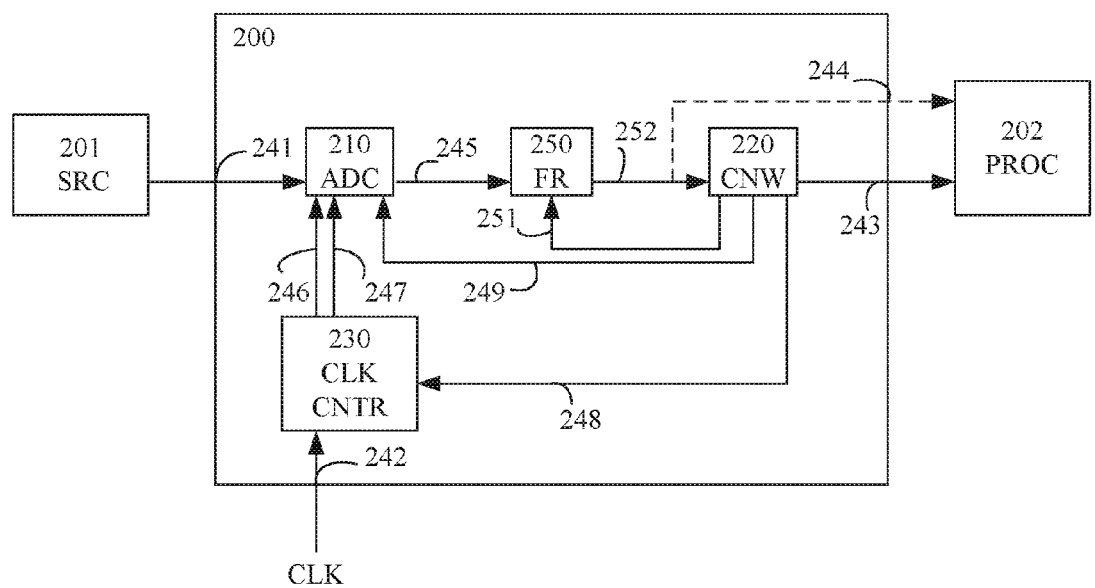
FIG. 2 is a block diagram illustrating an example arrangement comprising a cognitive signal converter according to some embodiments.

FIG. 2 is a schematic block diagram illustrating an example arrangement comprising a cognitive signal converter 200 according to some embodiments. The blocks 201, 202, 210, 220 and 230 of FIG. 2 are identical to (or at least similar to) the corresponding blocks 101, 102, 110, 120 and 130 of FIG. 1. Similarly, the signals 241, 242, 243, 245, 246, 247, 248 and 249 of FIG. 2 are identical to (or at least similar to) the corresponding signals 141, 142, 143, 145, 146, 147, 148 and 149 of FIG. 1. These blocks and signals will not be elaborated on further.

The cognitive signal converter 200 also comprises a framer (FR) 250, adapted to perform an image processing framing operation on the output 245 of the ADC 210 before forwarding it to the cognitive network 220 as the framed signal 252. The framed signal 252 may be directly output to the processor 202 according to some embodiments as illustrated by 244 in FIG. 2.

In this cognitive signal converter 200, the cognitive network 220 may also be adapted to control the framer 250 via control signal 251. For example, the cognitive network 220 may be adapted to detect a background item and a moving item of the framed signal 252 and control the framing operation of the image processing framer based on the detection. In some examples, the cognitive network 220 may be adapted to control the framing by indicating a position, direction and velocity of a moving item, and the framer 250 may adapt which parts of the frame it needs to convert and when based on these indications.

The cognitive signal converter 200 is particularly suitable for image processing applications.

Figure 3:
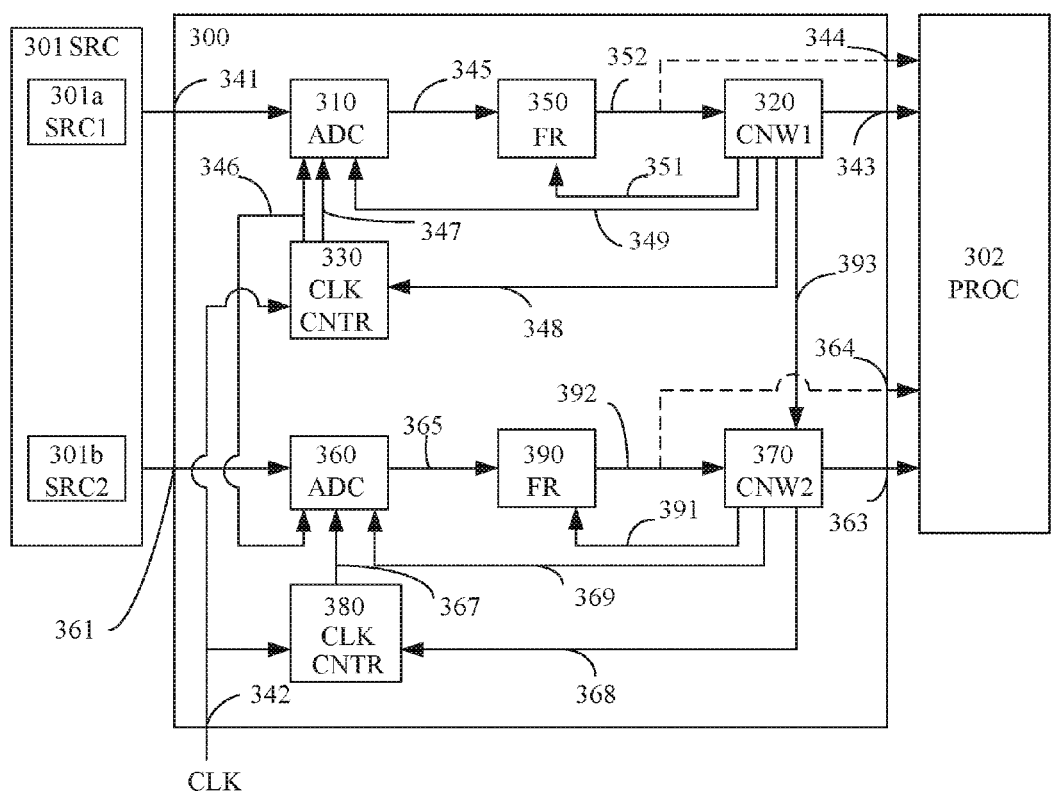
FIG. 3 is a block diagram illustrating an example arrangement comprising a cognitive signal converter according to some embodiments.

FIG. 3 is a schematic block diagram illustrating an example arrangement comprising a cognitive signal converter 300 according to some embodiments. The blocks 301, 302, 310, 320, 330 and 350 of FIG. 3 are identical to (or at least similar to) the corresponding blocks 201, 202, 210, 220, 230 and 250 of FIG. 2. Similarly, the signals 341, 342, 343, 344, 345, 346, 347, 348, 349, 351 and 352 of FIG. 3 are identical to (or at least similar to) the corresponding signals 241, 242, 243, 244, 245, 246, 247, 248, 249, 251 and 252 of FIG. 2. These blocks and signals will not be elaborated on further.

The cognitive converter 300 also comprises a second set of blocks—(ADC) 360, framer (FR) 390, cognitive network (CNW2) 370 and clock controller (CLK CNTR) 380— identical to (or at least similar to) the corresponding blocks—(ADC) 310, framer (FR) 350, cognitive network (CNW1) 320 and clock controller (CLK CNTR) 330— respectively.

The ADC 360 processes a second part of the analog input signal 361 based on a process clock signal 367, a sample clock signal 346 and a feedback signal 369 from the second cognitive network 370 to produce a digital converted signal 365.

The framer (FR) 390 is adapted to perform an image processing framing operation on the output 365 of the ADC 360 before forwarding it to the second cognitive network 370 as the framed signal 392. The framed signal 392 may be directly output to the processor 302 according to some embodiments as illustrated by 364 in FIG. 3.

The framed signal 392 is input to the second cognitive network 370, which may use it and (pre-coded and/or learnt) characteristics of the signal source 301 to predict the next sample of the digital converted signal, and controls (via control signal 368) the clock controller 380. The second cognitive network 370 may also be adapted to control the framer 390 via control signal 391.

In the example of FIG. 3, the sample clock 346 is the same for both of the ADC:s 310, 360 and is controlled by the first cognitive network (CNW1) 320. In other embodiments, the sample clock may differ between the ADC:s 310, 360 and may be controlled by the respective cognitive network 320, 370.

The first cognitive network (CNW1) 320 may be adapted to transfer information and/or control signals to the second cognitive network (CNW2) 370 via the connection 393. Thereby, predictions, detections, and control signals (or part(s) thereof) already achieved by the first cognitive network 320 need not be duplicated by the second cognitive network 370, which typically saves energy and/or processing resources.

The cognitive signal converter 300 is particularly suitable for 3D image processing applications (e.g. if the source 301 comprises a first source (SRC1) 301a which may be a first image capturing device such as a camera with high resolution and a second source (SRC2) 301b which may be a second image capturing device such as a camera with low resolution, wherein the first and second image capturing devices are located in relation to each other, e.g. at a distance corresponding to a typical distance between the eyes of a human, to collectively provide a 3D image).

Figure 4:
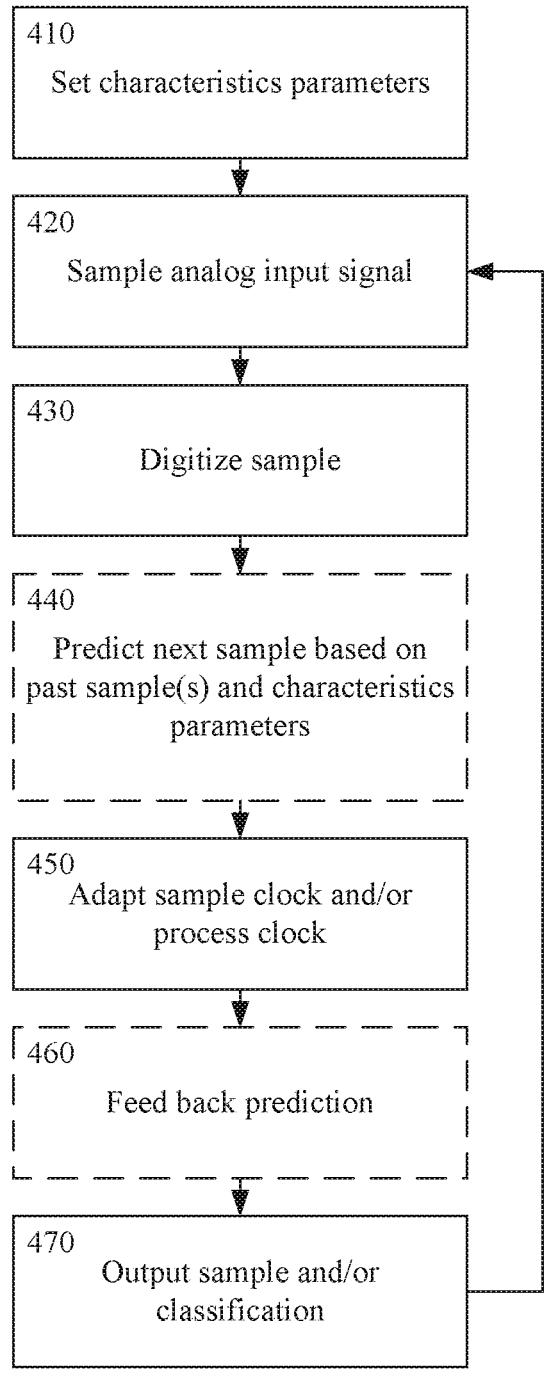
FIG. 4 is a flowchart illustrating example method steps according to some embodiments.

FIG. 4 illustrate an example method according to some embodiments. The method of FIG. 4 may, for example, be performed by any of the cognitive signal converters 100, 200, 300 or FIGS. 1, 2 and 3, respectively.

The method is initiated in step 410 by setting characteristics parameters that define the analog signal source to initial values. These characteristics parameters are used by the cognitive network as elaborated on above, and may be stationary or may be dynamically changed during processing of the analog signal.

Then, an analog input signal of the analog source is received via an analog signal input port of the cognitive signal converter and sampled, in step 420, by the analog-to-digital converter based on the sampling clock signal. The analog-to-digital converter digitizes (e.g. by quantization) the analog sample in step 430 to produce a sample of a digital converted signal based on the process clock signal.

In optional step 440, the cognitive network predicts the next sample of the digital converted signal based on the past sample(s) and the characteristics parameters. In step 450, the cognitive network controls the sample clock signal and the process clock signal based on the past sample(s) and the characteristics parameters (and possibly the predicted next sample), and in optional step 460, it feeds back the predicted sample to the analog-to-digital converter for use in the quantization of future samples.

The cognitive network also produces, in step 470, a digital output signal, which may be equal to the output from the analog-to-digital converter (possibly adjusted) or may be a classification of the current state of the analog input signal.

Figure 5:
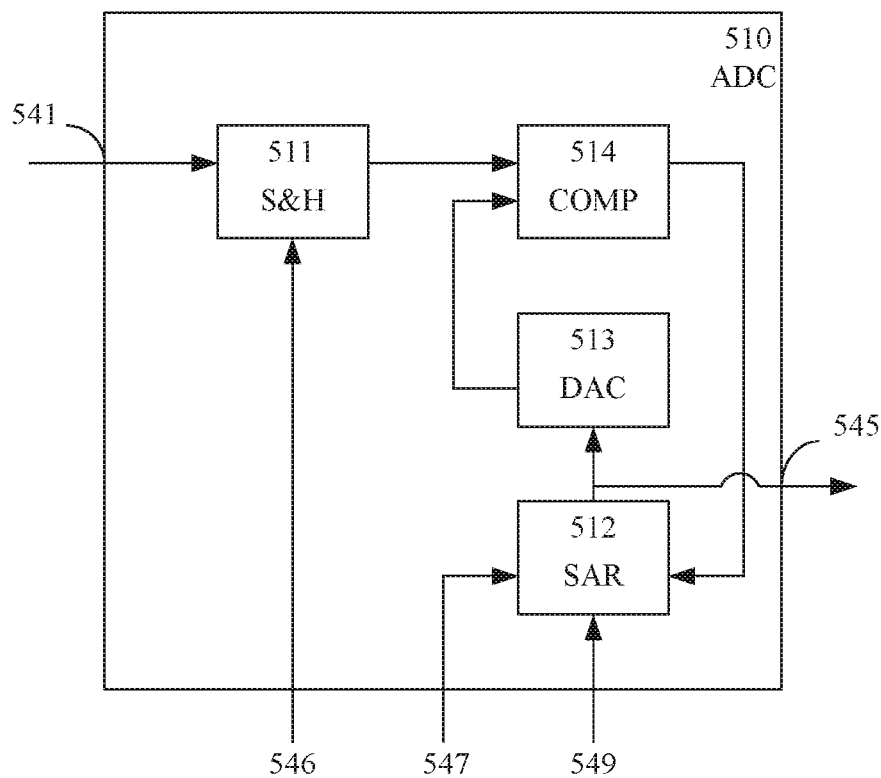
FIG. 5 is a block diagram illustrating an example analog-to-digital converter suitable for the cognitive signal converter according to some embodiments.

FIG. 5 is a schematic block diagram illustrating an example analog-to-digital converter (ADC) 510 suitable for the cognitive signal converter according to some embodiments. The ADC 510 may, for example, be used as any of the ADC:s 110, 210, 310 and 360 of FIGS. 1, 2 and 3.

The example ADC 510 is a successive approximation register (SAR) ADC (compare with WO 2013/123578 A1) and comprises a sample and hold unit (S&H) 511, a successive approximation register (SAR) 512, a digital-to-analog converter (DAC) 513 and a comparator (COMP) 514.

The sample and hold unit 511 is adapted to sample an analog input signal 541 (compare with signals 141, 241, 341 and 361 of FIGS. 1, 2 and 3) at a sampling rate defined by the sample clock signal 546 (compare with signals 146, 246 and 346 of FIGS. 1, 2 and 3).

A predicted next sample 549 may be stored in the successive approximation register 512, and at a processing rate determined by the processing clock signal 547 (compare with signals 147, 247, 347 and 367 of FIGS. 1, 2 and 3) the content of the successive approximation register 512 is converted to an analog value in the DAC 513 and compared with the sampled analog input signal in the comparator 514. Each comparison determines the value of a bit of the successive approximation register 512 and the successive approximation register 512 is updated accordingly. When the respective value of all bits has been determined the quantized sample value is output at 545.

Figure 6:
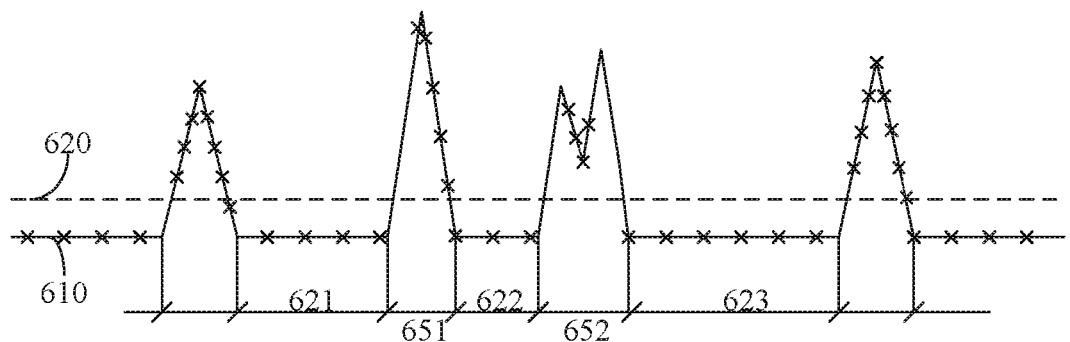
FIG. 6 is a schematic drawing illustrating processing of an analog input signal according to some embodiments.

FIG. 6 is a schematic drawing illustrating processing of an analog input signal 610 according to some embodiments. The signal 610 has three different states as shown in FIG. 6; a first state where the signal amplitude is close to zero (e.g. in the time spans illustrated by 621, 622, 623), a second state where the signal amplitude has a single peaked shape (e.g. in the time span illustrated by 651), and a third state where the signal amplitude has a double peaked shape (e.g. in the time span illustrated by 652).

When the signal is in the first state, it may only be important to know if the signal is about to transferred to another state and the sampling rate may be rather low. When the signal is in the second or third state, it may be crucial to have high resolution in time to determine which of the second and third state the signal is in and the sampling rate should be rather high.

Thus, the cognitive network may be adapted to compare the amplitude of the ADC output with a threshold value 620 and change the sampling rate from a low value to a high value if the amplitude of the ADC output is above the threshold value 620 while the amplitude of the previous ADC output was below the threshold value 620 (i.e. it predicts that this marks a transfer to the second or third state). The cognitive network may also be adapted to change the sampling rate from the high value to the low value when it has detected the second or third state. For example, the third state may be considered detected if an amplitude dip is experienced (as illustrated in time interval 652) and the second state may be considered detected if the amplitude of the ADC output falls below the threshold value 620 without any amplitude dip being experienced (as illustrated in time interval 651). Sampling times are illustrated with x in FIG. 6.

Thus, when the signal is in the first state, energy may be saved since there is less samples to process for the ADC. For example, if a time-interleaved ADC is applied, one or more of the constituent ADC:s may be put in a sleep mode and/or a processing rate may be lowered.

The digital output signal of the cognitive signal converter may comprise an indication of the current state of the analog input signal.

The described embodiments and their equivalents may be realized in software or hardware or a combination thereof. They may be performed by general-purpose circuits, such as digital signal processors (DSP), central processing units (CPU), co-processor units, field-programmable gate arrays (FPGA) or other programmable hardware, or by specialized circuits such as for example application-specific integrated circuits (ASIC). All such forms are contemplated to be within the scope of this disclosure.

Embodiments may appear within an electronic apparatus comprising circuitry/logic or performing methods according to any of the embodiments. The electronic apparatus may, for example, be a 3D tracking camera, a touch screen detector, a fingerprint classification device, an MPEG encoder/decoder, or an OFDM receiver/decoder.

Reference has been made herein to various embodiments. However, a person skilled in the art would recognize numerous variations to the described embodiments that would still fall within the scope of the claims. For example, it should be noted that in the description of embodiments, the partition of functional blocks into particular units is by no means limiting. Contrarily, these partitions are merely examples. Functional blocks described herein as one unit may be split into two or more units. In the same manner, functional blocks that are described herein as being implemented as two or more units may be implemented as a single unit without departing from the scope of the claims.

Hence, it should be understood that the details of the described embodiments are merely for illustrative purpose and by no means limiting. Instead, all variations that fall within the range of the claims are intended to be embraced therein.

The invention claimed is:

1. A cognitive signal converter connectable to an analog signal source via an analog signal input port and adapted to produce a digital output signal based on an analog input signal received via the analog signal input port, the cognitive signal converter comprising an analog-to-digital converter and a cognitive network, wherein:
   the analog-to-digital converter is adapted to produce a digital converted signal based on the analog input signal, a sample clock signal and a process clock signal by sampling the analog input signal in accordance with the sample clock signal and using the process clock signal to control an operational speed of the analog-to-digital converter when quantizing each analog input signal sample, wherein the quantizing process is operated by the process clock signal; and
   the cognitive network is adapted to:
      receive the digital converted signal of the analog-to-digital converter; control at least one of the sample clock signal and the process clock signal based on the received digital converted signal and one or more characteristics of the analog signal source; and
      produce the digital output signal based on the received digital converted signal.

2. The cognitive signal converter of claim 1 wherein the cognitive network is further adapted to:
   predict at least part of a next sample of the digital converted signal based on the received digital converted signal and one or more characteristics of the analog signal source; and
   control at least one of the sample clock signal and the process clock signal based on the at least partially predicted next sample.

3. The cognitive signal converter of claim 2 wherein the analog-to-digital converter is further adapted to produce the digital converted signal based on the at least partially predicted next sample.

4. The cognitive signal converter of claim 3 wherein the analog-to-digital converter is adapted to produce the digital converted signal by comparing a next sample of the analog input signal with the at least partially predicted next sample.

5. The cognitive signal converter of claim 2 wherein the cognitive network is adapted to control the sample clock in relation to a difference between the received digital converted signal and the at least partially predicted next sample.

6. The cognitive signal converter of claim 2 wherein the cognitive network is adapted to control the process clock in relation to a difference between the received digital converted signal and the at least partially predicted next sample.

7. The cognitive signal converter of claim 2 wherein the cognitive network is further adapted to control a conversion range of the analog-to-digital converter based on the at least partially predicted next sample.

8. The cognitive signal converter of claim 1 wherein the digital output signal is equal to one of:
the received digital converted signal;
an adjusted version of the received digital converted signal; and
a classification of the analog input signal based on the received digital converted signal.

9. The cognitive signal converter of claim 1 further comprising an image processing framer adapted to subject the digital converted signal of the analog-to-digital converter to a framing operation, and wherein the cognitive network is adapted to receive the framed digital converted signal as the digital converted signal of the analog-to-digital converter.

10. The cognitive signal converter of claim 9, wherein the cognitive network is further adapted to detect a background item of the framed digital converted signal and a moving item of the framed digital converted signal and to control the framing operation of the image processing framer based on the detection.

11. The cognitive signal converter of claim 9 wherein the analog-to-digital converter is a first analog-to-digital converter and the cognitive network is a first cognitive network, the cognitive signal converter further comprising a second analog-to-digital converter and a second cognitive network, wherein the first cognitive network is adapted to control the second cognitive network.

12. An integrated circuit comprising the cognitive signal converter of claim 1.

13. An electronic device comprising the cognitive signal converter of claim 1.

14. A method of operating an analog-to-digital converter, the method comprising:
receiving an analog input signal via an analog signal input port of a cognitive signal converter comprising the analog-to-digital converter;
producing a sample of a digital converted signal based on the analog input signal, a sample clock signal and a process clock signal by sampling the analog input signal in accordance with the sample clock signal and using the process clock
signal to control an operational speed of the analog-to-digital converter when quantizing the analog input signal sample, wherein the quantizing process is operated by the process clock signal;
controlling at least one of the sample clock signal and the process clock signal based on the digital converted signal and one or more characteristics of the analog signal source; and
producing a digital output signal based on the digital converted signal.

15. The method of claim 14 further comprising:
predicting at least part of a next sample of the digital converted signal based on the digital converted signal and one or more characteristics of the analog signal source; and
controlling at least one of the sample clock signal and the process clock signal based on the at least partially predicted next sample.

16. The method of claim 15 further comprising producing a next sample of the digital converted signal based on the at least partially predicted next sample.

17. An electronic device comprising the integrated circuit of claim 12.

* * * * *